US012486596B2

(12) United States Patent
Dong et al.

(10) Patent No.: US 12,486,596 B2
(45) Date of Patent: Dec. 2, 2025

(54) SYSTEM AND METHOD OF PRODUCING MONOCRYSTALLINE LAYERS ON A SUBSTRATE

(71) Applicant: KISELKARBID I STOCKHOLM AB, Kista (SE)

(72) Inventors: Lin Dong, Spånga (SE); Johan Peter Ekman, Saltsjöbaden (SE); Kassem Alassaad, Järfälla (SE)

(73) Assignee: KISELKARBID I STOCKHOLM AB, Kista (SE)

( * ) Notice: Subject to any disclaimer, the term of this patent is extended or adjusted under 35 U.S.C. 154(b) by 267 days.

(21) Appl. No.: 18/549,018

(22) PCT Filed: Feb. 18, 2022

(86) PCT No.: PCT/SE2022/050178

§ 371 (c)(1),
(2) Date: Sep. 5, 2023

(87) PCT Pub. No.: WO2022/191751

PCT Pub. Date: Sep. 15, 2022

(65) Prior Publication Data

US 2024/0150930 A1 May 9, 2024

(30) Foreign Application Priority Data

Mar. 11, 2021 (SE) .................................... 2150283-6

(51) Int. Cl.
*C30B 23/06* (2006.01)
*C23C 14/24* (2006.01)
(Continued)

(52) U.S. Cl.
CPC ............ *C30B 23/06* (2013.01); *C23C 14/243* (2013.01); *C23C 14/50* (2013.01); *C23C 14/0635* (2013.01); *C30B 29/36* (2013.01)

(58) Field of Classification Search
CPC ....... C30B 23/06; C30B 29/36; C23C 14/243; C23C 14/50; C23C 14/0635
See application file for complete search history.

(56) References Cited

U.S. PATENT DOCUMENTS 6,261,363 B1 7/2001 Vodakov et al.
7,918,937 B2 4/2011 Syvaejaervi et al.

FOREIGN PATENT DOCUMENTS

CA 3212500 A1 * 9/2022 ............. C30B 23/02
JP 2012036035 2/2012
(Continued)

OTHER PUBLICATIONS

Furusho T et al, "Effect of Tantalum in Cyrstal Growth of Silicon Carbide By Sublimation Close Space Technique", Japanese Journal of Applied Physics, Japan Society of Applied Physics, JP, (Dec. 1, 2001), vol. 40, No. 12, Part 01, doi:10.1143/JJAP.40.6737, ISSN 0021-4922, pp. 6737-6740, XP001093212 [AD] 1-14.

*Primary Examiner* — Robert M Kunemund
(74) *Attorney, Agent, or Firm* — DUANE MORRIS LLP; Gregory M. Lefkowitz

(57) ABSTRACT

A system (100) for producing an epitaxial monocrystalline layer on a substrate (20) comprising: an inner container (30) defining a cavity (5) for accommodating a source material (10) and the substrate (20); an insulation container (50) arranged to accommodate the inner container (30) therein; an outer container (60) arranged to accommodate the insulation container (50) and the inner container (30) therein; and heating means (70) arranged outside the outer container (60) and configured to heat the cavity (5), wherein the inner container (30) comprises a support structure for supporting a solid monolithic source material (10) at a predetermined distance above the substrate (20) in the cavity (5) such that a growth surface of the substrate (20) is entirely exposed to
(Continued)

the source material (10). A corresponding method is also disclosed.

14 Claims, 8 Drawing Sheets

(51) Int. Cl.

| | |
|---|---|
| ***C23C 14/50*** | (2006.01) |
| *C23C 14/06* | (2006.01) |
| *C30B 29/36* | (2006.01) |

(56) References Cited

FOREIGN PATENT DOCUMENTS

| | | | | |
|---|---|---|---|---|
| JP | 2021031311 | | 3/2021 | |
| WO | WO-2022191752 A1 | * | 9/2022 | ............. C30B 23/02 |

* cited by examiner

SYSTEM AND METHOD OF PRODUCING MONOCRYSTALLINE LAYERS ON A SUBSTRATE

CROSS-REFERENCE TO RELATED APPLICATIONS

This application is a § 371 national stage entry of International Application No. PCT/SE2022050178, filed Feb. 18, 2022, which claims priority to Sweden Application No. 2150283-6, filed Mar. 11, 2021, the entire contents of which are incorporated herein by reference.

TECHNICAL FIELD

The invention relates generally to growth of monocrystals or monocrystalline layers on a substrate. Specifically, the invention relates to sublimation growth of high-quality monocrystalline layers by using the sublimation sandwich method. More specifically, the invention relates to a new configuration of growth of high-quality monocrystalline layers by using the sublimation sandwich method.

BACKGROUND ART

In recent years, there has been an increasing demand for the improvement of the energy efficiency of electronic devices capable of operation at high power levels and high temperatures. Silicon (Si) is currently the most commonly used semiconductor for power devices. In recent decades, significant progress in the performance of Si-based power electronic devices has been made. However, with Si power device technology maturing, it becomes more and more challenging to achieve innovative breakthroughs using this technology. With a very high thermal conductivity (about 4.9 W/cm), high saturated electron drift velocity (about $2.7\times10^{7}$ cm/s) and high breakdown electric field strength (about 3 MV/cm), silicon carbide (SiC) is a suitable material for high-temperature, high-voltage, and high-power applications.

The most common technique used for the growth of SiC monocrystals is the technique of Physical Vapor Transport (PVT). In this growth technique, the seed crystal and a source material are both placed in a reaction crucible which is heated to the sublimation temperature of the source and in a manner that produces a thermal gradient between the source and the marginally cooler seed crystal. The typical growth temperature is ranging from 2200° C. to 2500° C. The process of crystallization lasts typically for 60-100 hours, SiC monocrystal obtained (herein being named as SiC boule or SiC ingot) during that time has the length of 15-40 mm. After growth, the SiC boule is processed by a series of wafering steps, mainly including slicing, polishing, and cleaning processes, until a batch of SiC wafers are produced. The SiC wafers should be usable for being the substrates, on which a SiC monocrystalline layer with a well controllable doping and which is several to several tens of micrometers in thickness, can be deposited by chemical vapor deposition (CVD).

The sublimation sandwich method (SSM) is another variant of the physical vapor transport (PVT) growth. Instead of SiC powder as source material, the source is a monolithic SiC plate of either mono- or polycrystalline structure, which is very beneficial for controlling the temperature uniformity. The distance between the source and the substrate is short for direct molecular transport (DMT), typically 1 mm, which has the positive effect that the vapor species do not react with the graphite walls. The typical growth temperature of SSM is about 2000° C., which is lower than that of PVT. Such lower temperature can help obtain higher crystal quality of SiC monocrystals or monocrystalline layers than that in PVT case. During the growth, the growth pressure is kept at vacuum condition, around 1 mbar, in order to achieve high growth rate, around 150 μm/h. Since the thickness of the source is typically 0.5 mm, the grown SiC layer has about the same thickness, which is thinner than that of PVT grown boules which typically are 15-50 mm long. Therefore, the obtained sample using SSM can be regarded as either a SiC mini-boule from the perspective of bulk growth or a super-thick SiC epitaxial layer from the perspective of epitaxy.

In SSM, a source and a seed are loaded in a graphite crucible, so that a small gap between the source and seed is formed. As revealed in the paper "Effect of Tantalum in Crystal Growth of Silicon Carbide by Sublimation Close Space Technique", Furusho et al., *Jpn. J. Appl. Phys. Vol.* 40 (2001) pp. 6737-6740 and U.S. Pat. No. 7,918,937 B2, the seed is loaded above the source, with the support of a spacer in the middle. Since the grown surface of the seed is toward the source side (face-down configuration), the spacer covers part of the seed surface (usually the seed edge region). The problem in the existing SSM configuration is that the growth is not realized on the entire seed. Therefore, after the growth, the grown area is always smaller than original seed area. This hinders the application of this technology to the production meeting semiconductor standard, which requires that the grown sample should have standard shape and diameter. It further makes it impossible to maintain or enlarge the diameter of the crystal when it is used as seed in consecutive growth sessions. For the reasons mentioned above the SSM cannot be used for substrate production applying the known substrate configuration.

Thus, there is a need to improve the known systems and methods mentioned above.

SUMMARY OF INVENTION

The herein described system and method overcomes the problems and deficiencies associated with the prior art and enables substrate production using the SSM with all its advantages compared to the PVT process; with respect to crystalline quality, lower defect density, freedom from basal plane dislocations and carbon inclusions, minimal crystal stress, minimal bow, minimal warpage, higher growth rate, flexibility with respect to substrate diameter, easy diameter enlargement, lower growth system investments and lower power consumption (during crystal growth).

With the foregoing and other objects in view there is provided, in accordance with a first aspect of the present disclosure, a system for producing an epitaxial monocrystalline layer on a substrate comprising: an inner container defining a cavity for accommodating a source material and the substrate; an insulation container arranged to accommodate the inner container therein; an outer container arranged to accommodate the insulation container and the inner container therein; and heating means arranged outside the outer container and configured to heat the cavity, wherein the inner container comprises a support structure for supporting a solid monolithic source material at a predetermined distance above the substrate in the cavity such that a growth surface of the substrate is entirely exposed to the source material, wherein the support structure comprises one or more first leg members having a first height and arranged to support the source material along a peripheral edge thereof, and one or more second leg members having a second height and arranged to support the substrate, wherein the first height is greater than the second height.

With the novel configuration in SSM presented above, it is possible to realize the growth on the entire substrate or seed, without leaving significant spacer-related non-growth regions or marks. In the new configuration, the source is arranged above the substrate, whilst turning the growth surface of the substrate upwards, i.e., in a face-up configuration. The source and the substrate are supported separately from each other by specially designed structures. More importantly, the structure used to support the source material, the latter in the form of a solid monolithic plate, does not come into contact with the structure used to support the substrate. Instead, the substrate support contacts only the backside of substrate, leading to the growth of the entire area of the substrate. In the context of the present invention, the term 'entirely exposed' should be interpreted as meaning that no part of the growth surface of the substrate facing the source material is covered or in contact with another component. The different heights of the leg members allow the substrate and the source to be arranged at different heights and without touching each other.

In one embodiment, the system further comprises at least one container support having a third height and being arranged to support the inner container within the insulation container. The container support elevates the inner container from the bottom surface of the insulation container, thereby enabling optimal temperature distribution by reducing heat transfer from the inner container to the insulation container through thermal conduction.

In one embodiment, the inner container, the insulation container and the outer container are cylindrical in shape, and the source material and/or the substrate are disk-shaped. The cylindrical shape facilitates a nearly uniform radial temperature distribution in the cavity and over the source and substrate. Preferably, an inner diameter of the inner container is in the range 100-500 mm, preferably 150-300 mm. This range corresponds to standard wafer sizes in semiconductor devices.

In one embodiment, the system further comprises a heating body made of high-density graphite arranged on top of the inner container in the cavity. The heating body allows for coupling with the heating means to provide heating and a close to optimal temperature distribution in the cavity.

In one embodiment, the surface area of the source material is greater than or equal to the surface area of the substrate. The greater or equal surface area of the source ensures optimal exposure of the entire growth surface of the substrate and facilitates positioning of the support structure for the source material.

In one embodiment, the inner container comprises an upper part with a lower wall section and a lower part with an upper wall section which are arranged to be joined together to form a sealing, leakproof connection. The two-part configuration facilitates assembly of the inner container after arranging the source and substrate therein.

In one embodiment, a top portion of the upper part has a first thickness, and a base portion of the lower part has a second thickness, wherein the first thickness is greater than or equal to the second thickness. This configuration facilitates optimal temperature distribution in the cavity in that heat loss is lower in the region of the source than in the region of the substrate.

In one embodiment, an inner diameter of the lower part is smaller than an inner diameter of the upper part, forming a ledge, wherein a ring-shaped member is arranged on the ledge. This configuration allows for arranging the ring-shaped member at a distance above the bottom surface of the lower part of the inner container. Preferably, the ring-shaped member comprises a plurality of inwardly extending radial protrusions for supporting the source material along a peripheral edge thereof. Thus, an alternative support structure for the source material is achieved.

In one embodiment, the ring-shaped member is made of tantalum, niobium, tungsten, hafnium and/or rhenium. This allows the ring-shaped member to act as a carbon getter.

In one embodiment, the insulation container comprises a top part, a middle part and a bottom part, wherein the insulation container is made of an insulating rigid porous graphite and wherein a fiber direction of the top part and the bottom part is orthogonal to a center axis of the insulation container, and a fiber direction of the middle part is parallel to the center axis of the insulation container. This orientation of the fiber directions reduces heat loss through both the top and bottom parts, as well as the middle part. Thus, an improved thermal insulation is provided.

In one embodiment, the heating means comprises radiofrequency coils which are movable along the outer container. The heating means provide for optimal heating of the cavity.

In a second aspect of the present disclosure, there is provided a method of producing an epitaxial monocrystalline layer on a substrate comprising:

- providing an inner container defining a cavity for accommodating a source material and a substrate;
- arranging the substrate in the cavity of the inner container;
- arranging a solid monolithic source material in the cavity of the inner container at a predetermined distance above the substrate such that a growth surface of the substrate is entirely exposed to the source material;
- arranging the inner container within an insulation container;
- arranging the insulation container and the inner container in an outer container;
- providing heating means outside the outer container to heat the cavity;
- evacuating the cavity to a predetermined low pressure;
- introducing an inert gas into the cavity;
- raising the temperature in the cavity to a predetermined growth temperature by the heating means;
- maintaining the predetermined growth temperature in the cavity until a predetermined thickness of the epitaxial monocrystalline layer on the substrate has been achieved; and
- cooling the substrate.

BRIEF DESCRIPTION OF DRAWINGS

The invention is now described, by way of example, with reference to the accompanying drawings, in which.

DESCRIPTION OF EMBODIMENTS

Figure 1:
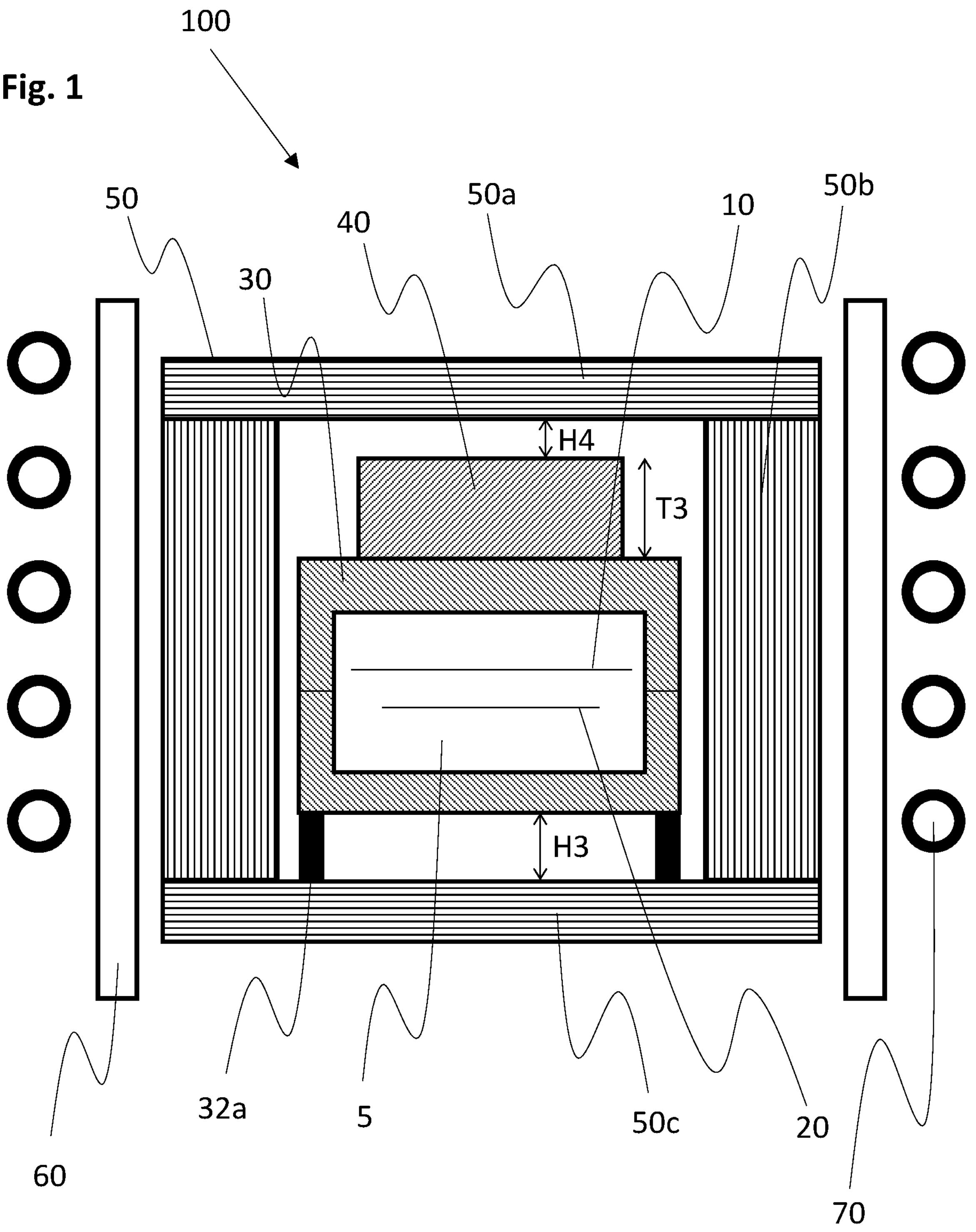
FIG. 1 shows a schematic cross-sectional view of a system for producing an epitaxial monocrystalline layer on a substrate according to one embodiment of the present disclosure.

In the following, a detailed description of a system for producing an epitaxial monocrystalline layer on a substrate according to the present disclosure is presented. In the drawing figures, like reference numerals designate identical or corresponding elements throughout the several figures. It will be appreciated that these figures are for illustration only and are not in any way restricting the scope of the invention.

FIG. 1 is a schematic illustration of a system 100 designed to facilitate sublimation epitaxy with high growth rate and high reproducibility, which enables the growth of a monocrystalline layer on a substrate. A source material 10 and a substrate 20 are arranged in a cavity of an inner container 30. The detailed configuration of the source material 10 and the substrate 20 will be explained later. The inner container 30 is arranged within an insulation container 50, which insulation container 50 in turn is arranged in an outer container 60. The inner container 30 is sitting on container supports 32*a* which in turn are on the top of a bottom part 50*c* of insulation container 50. A heating body 40 is arranged on top of the inner container 30. Outside said outer container 60 there are heating means 70, which can be used to heat the cavity of said inner container 30.

According to one embodiment the heating means 70 comprises an induction coil for radiofrequency heating. Said outer container 60 is in this example a quartz tube and said insulation container 50 and said inner container 30 are cylindrical and made of an insulating graphite foam and high-density graphite, respectively. The insulation container 50 and the inner container 30 may also be made of another suitable material which has the ability to withstand high temperatures and, when a radiofrequency induction coil is used as heating means 70, also facilitates coupling to said radiofrequency induction coil. The heating means 70 is used to heat the container and by this sublime the source material 10. The heating means 70 is movable in a vertical direction in order to adjust the temperature and thermal gradient in the inner container 30. The temperature gradient between the source material 10 and substrate 20 can also be altered by varying the properties of the inner container 30, such as the thicknesses of the upper part 31 and the lower part 32 as is known in the art. Additionally, there are pumps for evacuating the inner container (not shown), i.e. to provide a pressure between about 10-4 and 10-6 mbar.

The heating body 40 is made of high-density graphite. Furthermore, the heating body 40 may be coated. Together with the inner container 30, the heating body 40 couples with the electromagnetic field generated by the RF coils 70 to generate sufficient heat in the system. The shape of the heating body 40 is preferably a cylinder bulk shape; the thickness or height T3 of the heating body 40 is preferably adjusted in conjunction with the height of the inner container 30 to obtain a desired temperature distribution, as will be explained further below. The diameter of the heating body 40 is preferably 50-150% of the diameter of the inner container 30, more preferably 70-110%.

Figure 2A:
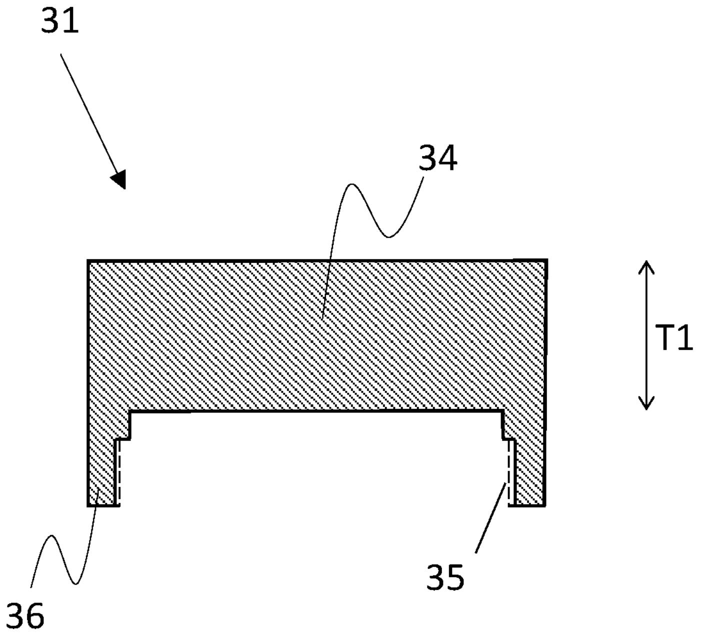
FIGS. 2*a* and 2*b* show schematic cross-sectional view of upper and lower parts of an inner container according to one embodiment of the present disclosure.
Figure 2B:
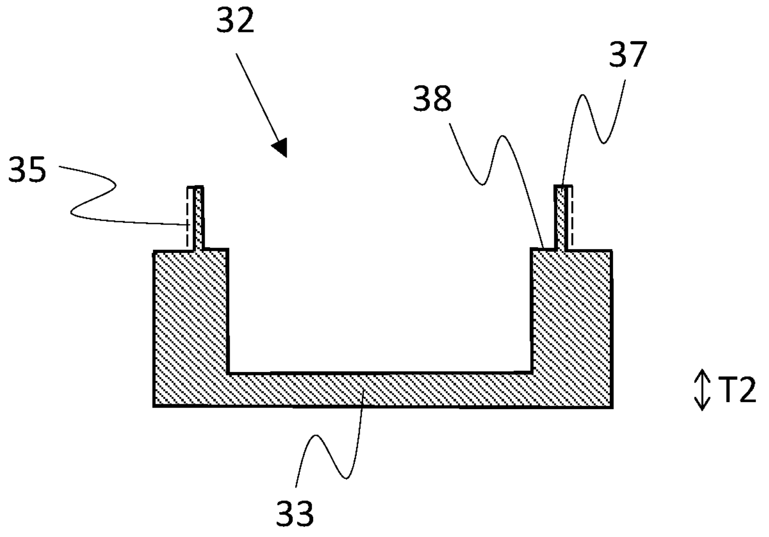

FIGS. 2*a* and 2*b* are drawings of an exemplifying inner container 30, having a cylindrical or tubular shape, which is made of high-density graphite. High-density graphite is used as it withstands high temperatures and facilitates a coupling to the electromagnetic field generated by the RF-coils 70, in order to facilitate heating of the content of the inner container. FIG. 2*a* illustrates the upper part 31 of the inner container 30 and FIG. 2*b* illustrates the lower part 32 of the inner container 30, respectively. When the inner radius of the inner container 30 is adjusted to the radius of the source material 10 and the substrate 20, these are easily centered in the inner container 30. The inner container 30 shown in FIGS. 2*a* and 2*b*, the diameter of which is 100 mm, 150 mm, 200 mm or 250 mm, are specifically suitable for growth on substrates having a diameter of about 50 mm, 100 mm, 150 mm or 200 mm, respectively. The top portion 34 of the upper part 31 has a first thickness T1 and the base portion 33 of the lower part 32 has a second thickness T2.

With reference to the heating body 40 described above, the total height of the top portion 34 and the heating body 40, i.e. the sum of the first thickness T1 and third thickness T3, is larger than the height of the base portion 33, i.e. the second thickness T2. This is in order to facilitate a suitable vertical temperature gradient within the inner container 30, and also in order to improve temperature uniformity in a horizontal direction or a direction substantially orthogonal to the cylinder axis of said inner container 30 or a direction orthogonal to an epitaxial layer growth direction. In one example, T2=15 mm and the sum T1+T3=50 mm.

The vertical temperature gradient between the source material 10 and the substrate 20 is preferably 1-5° C./mm and the horizontal temperature gradient of the substrate 20 is preferably lower than 0.3° C./mm. It should be noted that the positive value of the vertical temperature gradient means that the temperature on the upper part 31 (the source material 10) side is higher than that of the lower part 32 (the substrate 20) side, while the positive value of the horizontal temperature gradient means that the center temperature of the substrate 20 is lower than that of the edge of substrate 20. Such uniform temperature distribution is important for the thickness and doping uniformity of the epitaxially grown monocrystalline layer.

Moreover, the inner container 30 preferably is provided with fastening means 35, such as a catch or threads, providing a sealing connection in order to make the container sufficiently leakproof and avoid losses of vapor species, particularly silicon, to such amounts that the stability of growth is disturbed. The lower part 32 of FIG. 2*b* is provided with threads 35, having a pitch of 2 mm, on the outer side of its upper wall 37. The upper part 31 of FIG. 2*a* is provided with corresponding threads 35 on the inner side of its lower wall 36.

Figure 3:
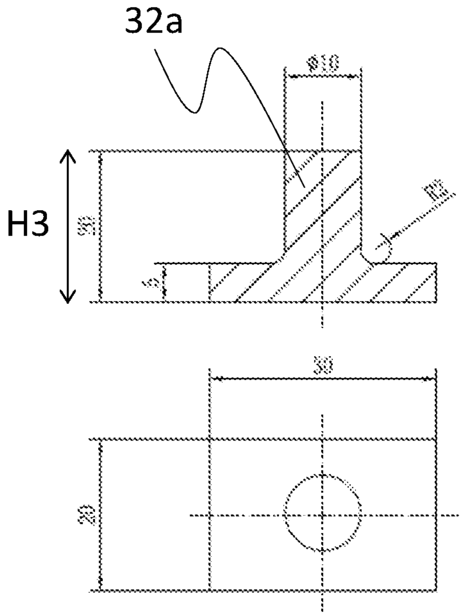
FIG. 3 shows cross-sectional and top views of a container support according to one embodiment of the present disclosure.

The container supports 32*a* are made of a material able to withstand high temperatures, preferably high-density graphite or a metal with high melting point, like tantalum (Ta). The configuration of the container supports 32*a* is given in FIG. 3. It should be noted that the configuration of the container supports 32*a* in FIG. 3 is just an example and does not limit any other possible design of the container supports 32*a*. The container supports 32*a* have a height H3. In one embodiment, the height H3 is chosen such that that the free space H4 above and below the inner container 30 in the cavity 5, optionally including the heating body 40, is substantially equal in order to provide a uniform temperature distribution.

In one embodiment, the inner diameter of the lower part 32 is smaller than the inner diameter of the upper part 31, thus forming a ledge 38 in the upper wall 37. As may be seen in FIG. 5, the cavity 5 in the inner container 30 formed by the recesses in the upper and lower parts 31, 32, respectively, is wider near the upper part 31 than near the lower part 32. The ledge 38 provides a surface for arranging other components in the cavity 5, as will be further described below.

Figure 4:
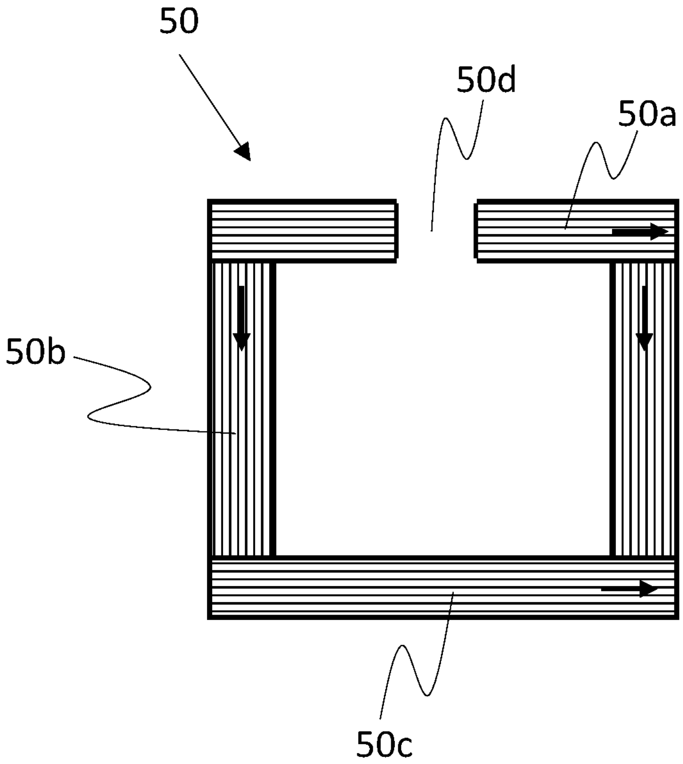
FIG. 4 shows a schematic cross-sectional view of an insulation container according to one embodiment of the present disclosure.

FIG. 4 is an exemplifying drawing of an insulation container 50, which comprises an upper part 50*a*, a middle part 50*b* and a bottom part 50*c*. The top part 50*a* and the bottom part 50*c* have a fiber direction orthogonal to the center axis of the insulation container 50 (the arrows in FIG. 3), whereas the middle part 50*b* has a fiber direction parallel to the center axis. Such fiber orientations can help improving the heat dissipation and then improve the temperature uniformity. Additionally, the top part 50*a* has a measurement hole 50*d* in the middle, for the purpose of the temperature monitoring during the growth. To maintain a good heat insulating property, the size of the measurement hole 50*d* should be as small as possible, without influencing the temperature measurement accuracy.

The above-mentioned system design has a number of advantages. In particular, the system is designed such that a higher and more even heat distribution at the substrate and the source material is achieved. This is favorable as a higher temperature increases the growth rate, and a more even heat distribution improves the quality of the epitaxial layer. The geometry of the insulation container 50 and the inner container 30 contributes to establishing the desired temperature profiles which are necessary for obtaining growth conditions at which high-quality material can be attained. Although particular measures have been given as examples in relation to FIGS. 1-4 there are other designs which also gives the desired growth conditions.

Figure 5:
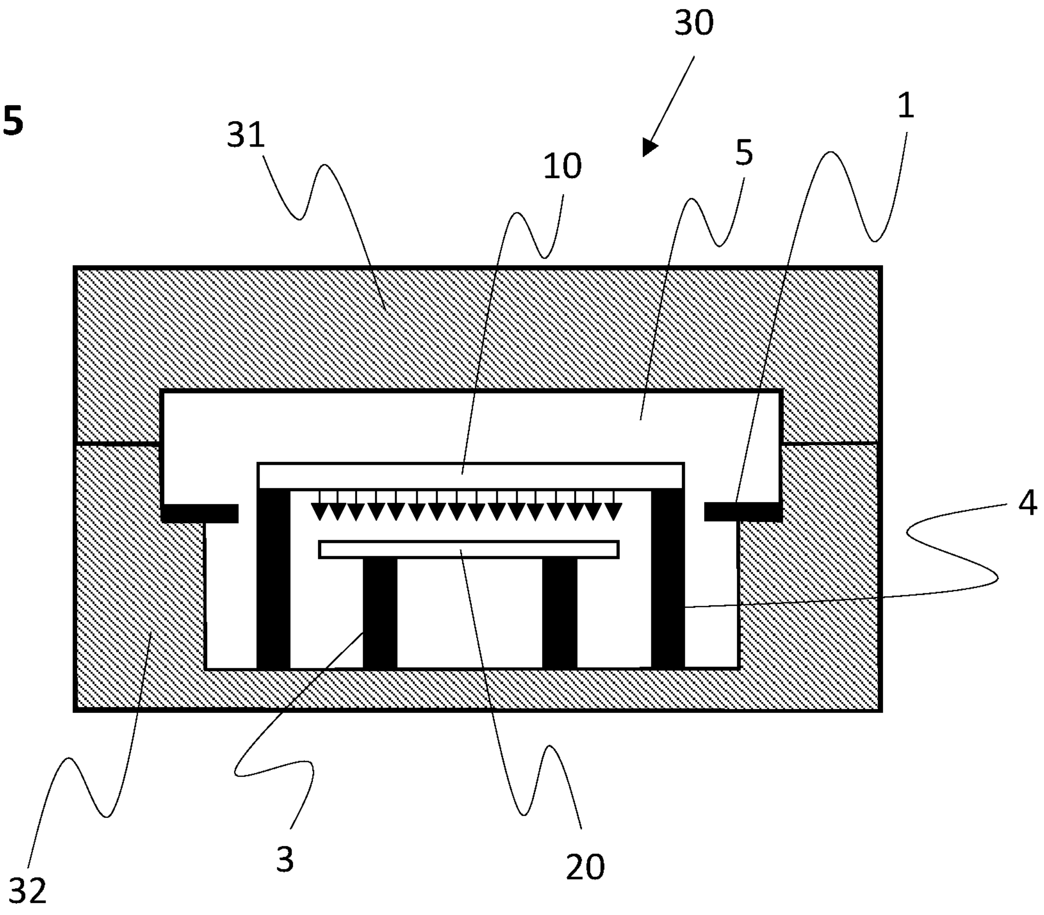
FIG. 5 shows a schematic cross-sectional view of an inner container with a source material and a substrate arranged therein according to one embodiment of the present disclosure.

FIG. 5 is a schematic illustration of one embodiment showing the arrangement of components 1, 3, 10, 20 within the inner container 30. A source material 10 is supported by a source support 4 and is arranged above the substrate 20, which is supported by a substrate support 3. The diameter of the source material 10 should be larger than that of the substrate 20. For example, if the substrate 20 has a diameter of 150 mm, the source material 10 should be 160 mm in diameter. Close to the source, a carbon getter 1 is loaded on the ledge 38 of the side wall 37 of the inner lower part 32. The carbon getter 1 can be made of a material having a melting point higher than 2200° C. and having an ability of forming a carbide layer with carbon species evaporated from SiC, such as tantalum, niobium and tungsten.

Figure 6A:
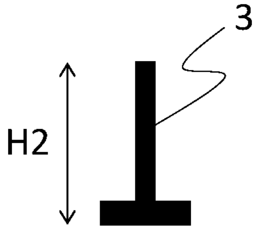
FIGS. 6*a* and 6*b* show schematic side views of first and second leg members constituting a support structure according to the embodiment shown in FIG. 5.
Figure 6B:
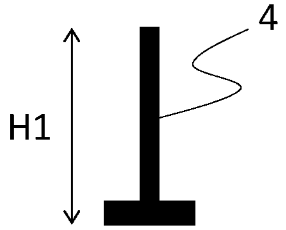

FIGS. 6*a* and 6*b* show schematic drawings of the substrate support 3 and the source support 4. The main difference between the source support 4 and the substrate support 3 is the height. In order to support the material stably, the number for each of them is three. For the substrate support 3, the contact position with the substrate 20 is not strictly defined, as long as it can support the substrate 20 stably. For the source support 4, as shown in FIG. 4, the contact position with the source material 10 should be at edge of the source material 10. In other words, if the diameters of the source material 10 and the substrate 20 are 160 mm and 150 mm, respectively, the contact position with the source material 10 should be an area between 151 mm to 160 mm in diameter. The source support 4 and the substrate support 3 are made of a material able to withstand high temperatures, preferably high-density graphite or a high-melting point metal like tantalum (Ta).

As mentioned above, the source material 10 is to be arranged above the substrate 20 on the source support structure 4. To achieve this, the source material 10 is a solid monolithic plate, sufficiently rigid to enable the source material 10 to be supported along a peripheral edge thereof. In one embodiment, the source material 10 is a monolithic SiC plate to produce an epitaxial monocrystalline SiC layer on the substrate 20 through SSM. However, other source materials may also be used in conjunction with the system 100 and method of the present disclosure depending on the desired epitaxial layer to be produced, such as e.g., aluminum nitride (AlN).

Figure 7:
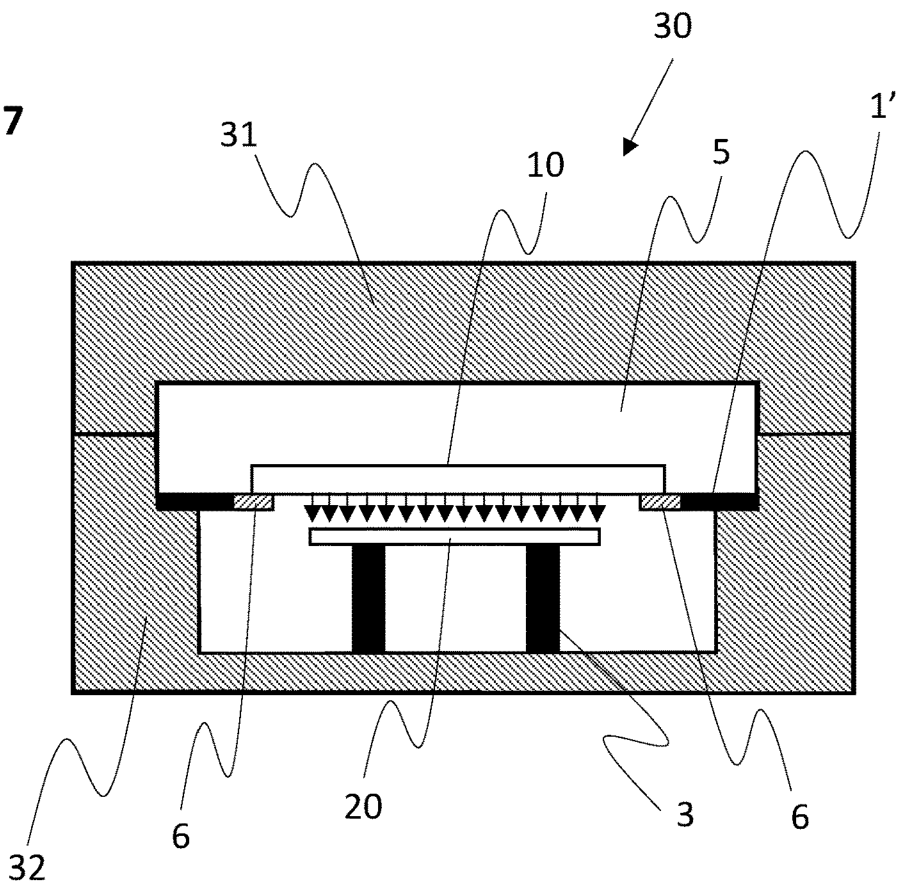
FIG. 7 shows a schematic cross-sectional view of an inner container with a source material and a substrate arranged therein according to an alternative embodiment of the present disclosure.

Referring now to FIG. 7, there is shown an alternative embodiment of the support structure for the source material 10. In this embodiment, the support structure is ring-shaped and comprises a plurality of protrusions 6, oriented radially inwards and distributed substantially regularly along the circumference. The protrusions 6 provide support surfaces for supporting the source material 10 along its peripheral edge. Advantageously, the support structure is incorporated in the alternative carbon getter 1', which then performs the dual function of gathering excess carbon from the sublimation of the source material 10 as well as supporting the source material 10 in a position above the substrate 20.

Figure 8:
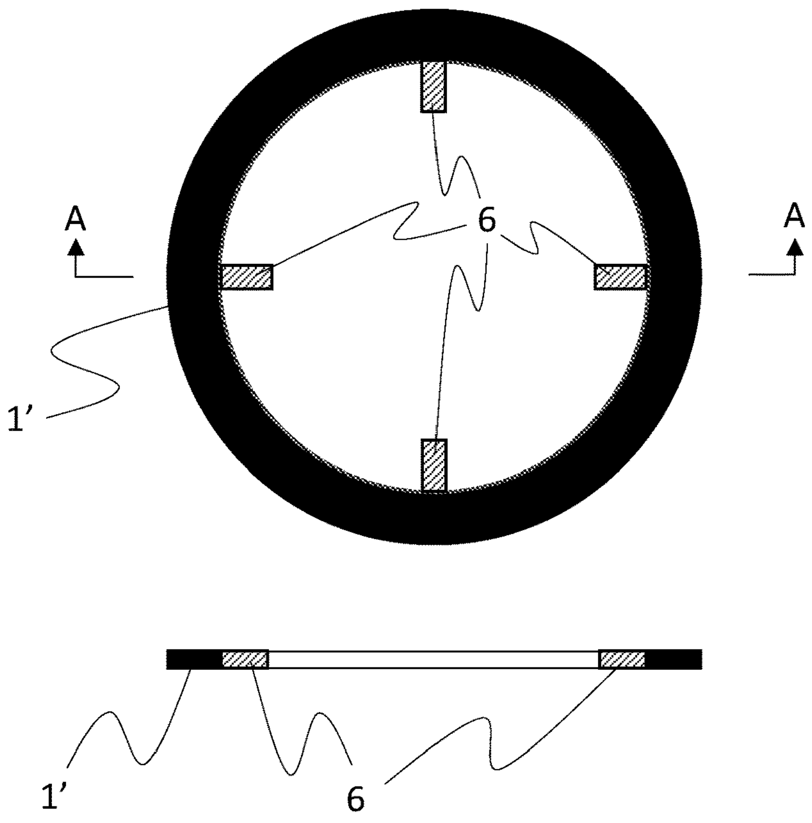
FIG. 8 shows top and cross-sectional views of a ring-shaped member constituting a support structure according to the embodiment shown in FIG. 7.

FIG. 8 shows a schematic drawing of the ring-shaped carbon getter 1, which has a ring shape. The diameter of the carbon getter 1 should match the inner diameter of the lower part 32. For example, for the lower part 32 with an inner diameter of 200 mm, the outer diameter of the carbon getter 1 should be 198 mm; it is obvious from the FIG. 5 that the inner diameter of the carbon getter 1 should have larger diameter than the source material 10. For the source material 10 with 160 mm in diameter, the inner diameter of the carbon getter 1 is preferably 170 mm. As may be understood, the protrusions 6 are provided with the alternative carbon getter 1' for the embodiment of FIG. 7, whereas the carbon getter 1 in the embodiment of FIG. 5 has no protrusions.

The positions of the source material 10 and the substrate 20 in the inner container 30 as well as the relative distance between the source material 10 and the substrate 20 are determined by the first height H1 of the source support 4 and the second height H2 of the substrate support 3. For example, if the total height of the cavity 5 of the inner container 30 is 20 mm, H1 is preferably 17 mm. The relative distance between the source material 10 and the substrate 20 in SSM is preferably set to be 1 mm, H2 is equivalent to the value of using H1 to subtract 1 mm and the thickness of the substrate 20. In other words, if the substrate 20 has thickness of 1 mm, H2 equals 15 mm.

The method will now be described with reference to a system design as described above, but the man skilled in the art knows that the design is only an example and that other designs can also be used as long as the desired growth conditions are achieved.

Figure 9:
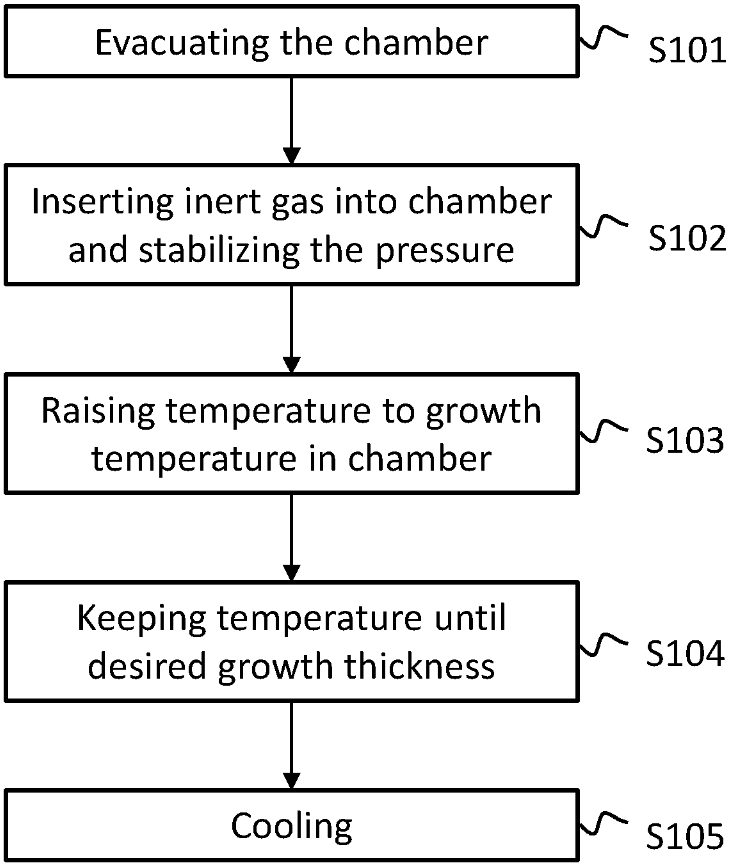
FIG. 9 shows a flow chart illustrating steps of a method according to one embodiment of the present disclosure.

FIG. 9 illustrates the process flow in this method. The growth process comprises a pre-heating phase S101 wherein the system 100 is set up in accordance with the above description, and the inner container 30 is evacuated using conventional pumping means. A base vacuum level of lower than 10-4 mbar is normally desired, preferably between 10-4 and 10-6 mbar. After that, an inert gas, preferably argon (Ar), is inserted into the cavity 5 to obtain a pressure lower than 950 mbar, preferably 600 mbar (S102). The system is then heated up (S103). The inventors have discovered that the optimal increase of the temperature is preferably in the range 10-50° C./min, and more preferably about 20-30° C./min. Such a temperature increase provides a good initial sublimation of the source and nucleation. The temperature is raised until a desired growth temperature in the range 1900-2000° C., typically about 1950° C., is reached. When a suitable growth temperature has been reached, i.e. a growth temperature which facilitates a desired growth rate, the pressure is slowly decreased to the growth pressure. The man skilled in the art knows at which temperatures a desired growth rate is obtained. The temperature is kept at this growth temperature, until an epitaxial layer of desired thickness has been achieved. The period following the heating phase is referred to as the growth phase S104, during this phase the temperature is preferably kept substantially constant. In one embodiment, the thickness of the epitaxial layer obtained in the growth phase S104 is 1500 μm.

When a desirably thick monocrystalline layer has been produced the heating is ramped down and the substrate is allowed to cool, this is referred to as the cooling phase S105. The pre-heating and the cooling phase can be optimized in order to decrease the production time.

Figure 10:
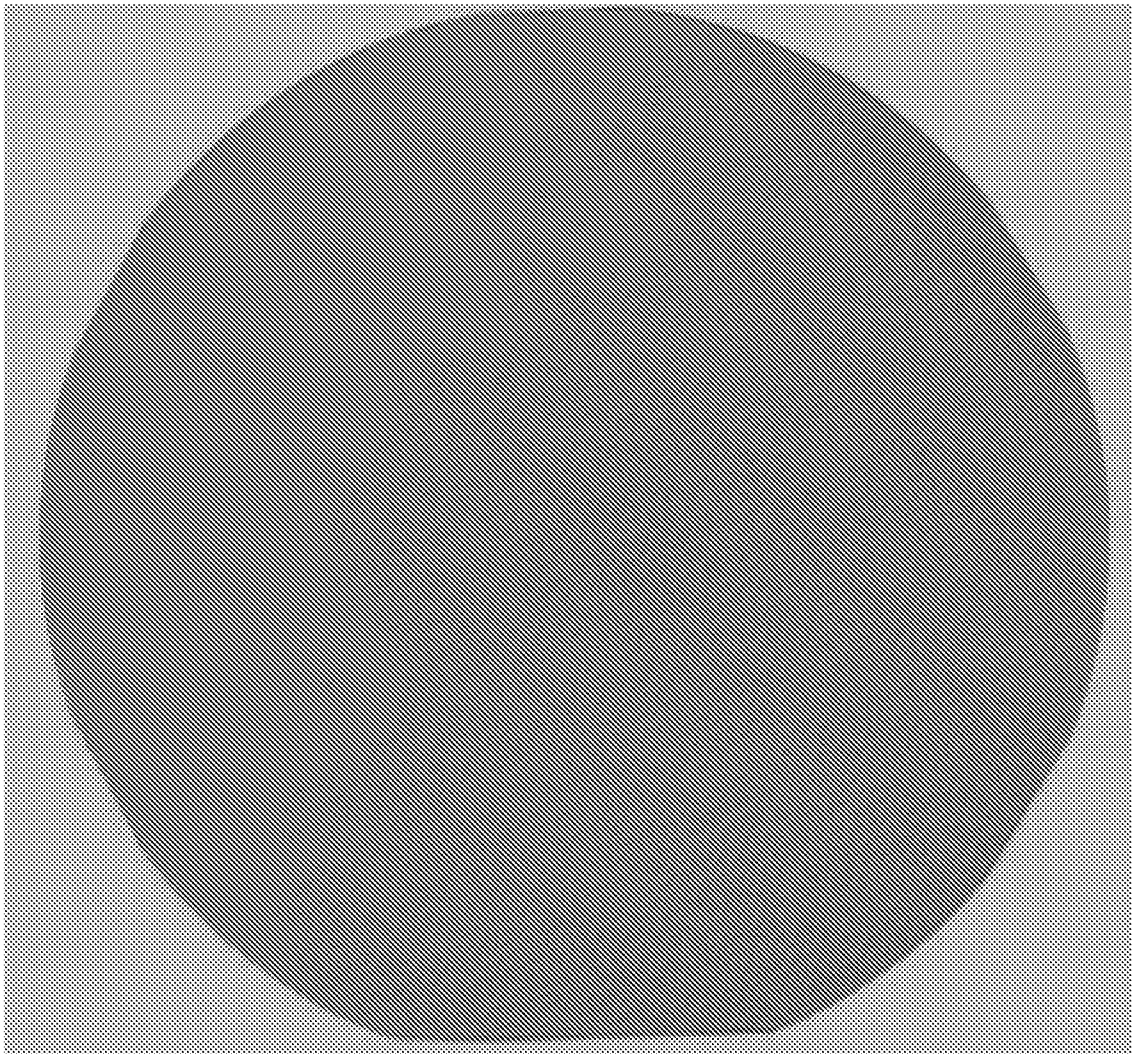
FIG. 10 shows the appearance of a grown SiC sample produced in accordance with the present disclosure.

FIG. 10 gives the appearance of a grown SiC sample using this method. A 1.5 mm thick 4H-SiC monocrystalline layer has been grown on the entire 150 mm seed surface without leaving spacer marks.

Figure 11A:
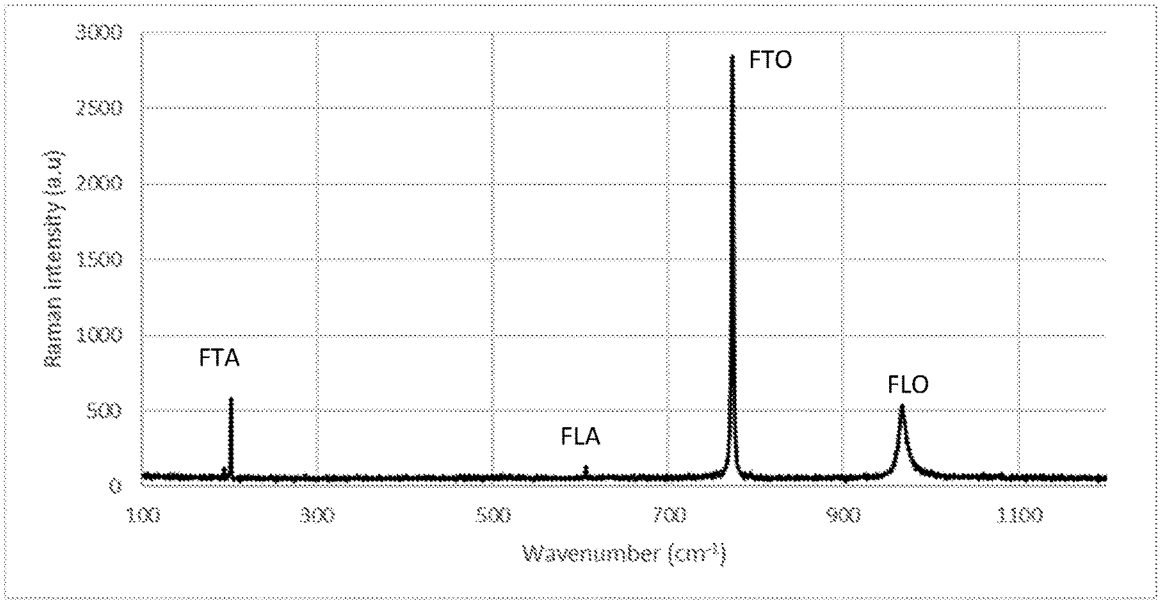
FIGS. 11*a* and 11*b* illustrate the crystal quality evaluation using Raman spectroscopy and X-ray diffraction (XRD) spectroscopy for a 1.5 mm thick 4H-SiC monocrystalline epitaxial layer with 150 mm in diameter, manufactured in accordance with the present disclosure.
Figure 11B:
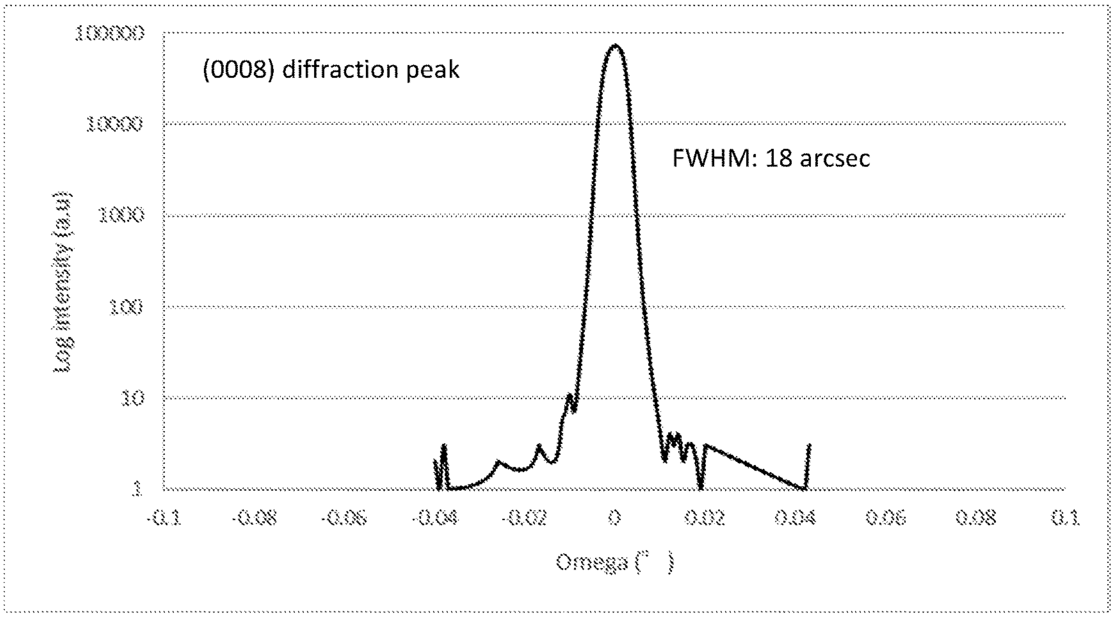

FIGS. 11*a* and 11*b* illustrate the crystal quality evaluation using Raman spectroscopy and X-ray diffraction (XRD) spectroscopy for a 1.5 mm thick 4H-SiC monocrystalline epitaxial layer with 150 mm in diameter, manufactured according to the inventive method. FIG. 11*a* shows the Raman peaks with wavenumbers of 204 $cm^{-1}$, 610 $cm^{-1}$, 776 $cm^{-1}$ and 968 $cm^{-1}$, which correspond to Folded Transversal Acoustic (FTA), Folded Longitudinal Acoustic (FLA), Folded Transversal Optical (FTO), and Folded Longitudinal Optical (FLO) peaks of 4H-SiC. FIG. 11*b* shows the XRD rocking curve of (0008) plane for this sample. The full width at half maximum (FWHM) value is about 18 arc second, which indicates a high quality of 4H-SiC monocrystal.

Although the present disclosure has been described in detail in connection with the discussed embodiments, various modifications may be made by one of ordinary skill in the art within the scope of the appended claims without departing from the inventive idea of the present disclosure. Further, the method can be used to produce more than one layer in the same cavity as is readily realized by the man skilled in the art.

All the described alternative embodiments above or parts of an embodiment can be freely combined without departing from the inventive idea as long as the combination is not contradictory.

The invention claimed is:

1. A system for producing an epitaxial monocrystalline layer on a substrate comprising:

an inner container defining a cavity for accommodating a source material and a substrate;

an insulation container arranged to accommodate the inner container therein;

an outer container arranged to accommodate the insulation container and the inner container therein; and heating means arranged outside the outer container and configured to heat the cavity, wherein the inner container comprises a support structure for supporting a solid monolithic source material at a predetermined distance above the substrate in the cavity such that a growth surface of the substrate is entirely exposed to the source material, wherein the support structure comprises one or more first leg members having a first height (H1) and arranged to support the source material along a peripheral edge thereof, and one or more second leg members having a second height (H2) and arranged to support the substrate, wherein the first height (H1) is greater than the second height (H2).

2. The system according to claim 1, further comprising at least one container support having a third height (H3) and being arranged to support the inner container within the insulation container.

3. The system according to claim 1, wherein the inner container, the insulation container and the outer container are cylindrical in shape, and the source material and/or the substrate are disk-shaped.

4. The system according to claim 3, wherein an inner diameter of the inner container is in the range 100-500 mm, preferably 150-300 mm.

5. The system according to claim 1, further comprising a heating body made of high-density graphite arranged on top of the inner container in the cavity.

6. The system according to claim 1, wherein the surface area of the source material is greater than or equal to the surface area of the substrate.

7. The system according to claim 1, wherein the inner container comprises an upper part with a lower wall section and a lower part with an upper wall section which are arranged to be joined together to form a sealing, leakproof connection.

8. The system according to claim 7, wherein a top portion of the upper part has a first thickness (T1), and a base portion of the lower part has a second thickness (T2), wherein the first thickness (T1) is greater than or equal to the second thickness (T2).

9. The system according to claim 7, wherein an inner diameter of the lower part is smaller than an inner diameter of the upper part, forming a ledge, wherein a ring-shaped member (1; 1') is arranged on the ledge.

10. The system according to claim 9, wherein the ring-shaped member (1; 1') comprises a plurality of inwardly extending radial protrusions for supporting the source material along a peripheral edge thereof.

11. The system according to claim 9, wherein the ring-shaped member (1; 1') is made of tantalum, niobium, tungsten, hafnium and/or rhenium.

12. The system according to claim 1, wherein the insulation container comprises a top part (50*a*), a middle part (50*b*) and a bottom part (50*c*), wherein the insulation container is made of an insulating rigid porous graphite and wherein a fiber direction of the top part (50*a*) and the bottom part (50*c*) is orthogonal to a center axis of the insulation container, and a fiber direction of the middle part (50*b*) is parallel to the center axis of the insulation container.

13. The system according to claim 1, wherein the heating means comprises radiofrequency coils which are movable along the outer container.

14. A method of producing an epitaxial monocrystalline layer on a substrate comprising:

providing an inner container defining a cavity for accommodating a source material and a substrate;

arranging the substrate in the cavity of the inner container;

arranging a solid monolithic source material in the cavity of the inner container at a predetermined distance above the substrate such that a growth surface of the substrate is entirely exposed to the source material;

arranging the inner container within an insulation container;

arranging the insulation container and the inner container in an outer container;

providing heating means outside the outer container to heat the cavity;

evacuating (S101) the cavity to a predetermined low pressure;

introducing (S102) an inert gas into the cavity;

raising (S103) the temperature in the cavity to a predetermined growth temperature by the heating means;

maintaining (S104) the predetermined growth temperature in the cavity until a predetermined thickness of the epitaxial monocrystalline layer on the substrate has been achieved; and cooling (S105) the substrate.

* * * * *